United States Patent [19]

Namiki et al.

[11] Patent Number: 4,482,625
[45] Date of Patent: Nov. 13, 1984

[54] PROCESS FOR PREPARING A COLOR PROOFING SHEET

[75] Inventors: Tomizo Namiki; Tomohisa Tago; Mikio Totsuka; Fumiaki Shinozaki, all of Shizuoka, Japan

[73] Assignee: Fuji Photo Film Co., Ltd., Kanagawa, Japan

[21] Appl. No.: 555,736

[22] Filed: Nov. 28, 1983

[30] Foreign Application Priority Data

Nov. 26, 1982 [JP] Japan ............... 57-207342

[51] Int. Cl.³ ............... G03C 1/54; G03C 5/08
[52] U.S. Cl. ............... 430/143; 430/257; 430/260; 430/293
[58] Field of Search ............... 430/143, 257, 293, 260

[56] References Cited

U.S. PATENT DOCUMENTS

| 3,060,023 | 10/1962 | Burg et al. | 430/170 X |
|---|---|---|---|
| 3,060,024 | 10/1962 | Burg et al. | 430/291 X |
| 3,060,025 | 10/1962 | Burg et al. | 430/291 |
| 3,136,637 | 6/1964 | Larson | 430/162 |
| 3,210,187 | 10/1965 | Thommes | 430/258 X |
| 3,479,185 | 11/1969 | Chambers | 430/278 |
| 3,481,736 | 12/1969 | Ruff | 430/254 |
| 3,527,604 | 9/1970 | Endermann et al. | 430/143 |
| 3,607,264 | 9/1971 | Celeste et al. | 430/291 X |
| 3,615,435 | 10/1971 | Fu-Hua Chu | 430/293 X |
| 3,671,236 | 6/1972 | van Beusekom | 430/143 |
| 3,718,473 | 2/1973 | Gervay et al. | 430/260 |
| 3,721,557 | 3/1973 | Inoue | 430/257 |
| 3,798,034 | 3/1974 | Laridon | 430/143 |
| 3,900,325 | 8/1975 | Christesen et al. | 430/260 X |
| 3,930,865 | 1/1976 | Faust et al. | 430/260 |
| 4,093,464 | 6/1978 | Ruckert et al. | 430/143 X |
| 4,304,836 | 12/1981 | Cheema et al. | 430/252 |
| 4,334,006 | 6/1982 | Kitajima et al. | 430/143 X |
| 4,360,582 | 11/1982 | Taguchi et al. | 430/260 |
| 4,396,700 | 8/1983 | Kitajima et al. | 430/143 X |

Primary Examiner—John E. Kittle
Assistant Examiner—Mukund J. Shah
Attorney, Agent, or Firm—Sughrue, Mion, Zinn, Macpeak & Seas

[57] ABSTRACT

A process for preparing a color proofing sheet is disclosed. The process comprises imagewise exposing a light-sensitive image-forming material comprising a transparent support having provided thereon a dye- or pigment-containing light-sensitive photoresist composition layer or both a dye- or pigment-containing colorant layer and a light-sensitive photoresist composition layer through a color separation mask, developing the material to form a color separation image, transferring the color separation image onto a photopolymerizable image-receiving layer, transferring in registration at least one more color separation image onto the same image-receiving layer to obtain a multicolored color proofing sheet on a single support, and totally exposing the image-receiving layer after the image transfer in an amount sufficient to induce photopolymerization thereof. A color proofing sheet realizing color reproduction essentially the same as actual print copies and has a good image strength and non-tackiness can be obtained by the process.

13 Claims, 7 Drawing Figures

PROCESS FOR PREPARING A COLOR PROOFING SHEET

FIELD OF THE INVENTION

The present invention relates to a process for preparing a multicolored color proofing sheet for use in color proofing and, more particularly, to a process for preparing a multicolored color proofing sheet having high image film strength.

BACKGROUND OF THE INVENTION

There are two known types of color proofing methods: the overlay type and the surprint type. One example of the overlay type method is disclosed in U.S. Pat. No. 3,136,637. In this overlay type proofing system, colored sheets exposed through respective proper color separation negatives and developed are superposed upon each other to produce a color proofing sheet.

This overlay type method has the advantages that it is quite simple and that it can serve as a progressive proof by combining two or three colors in registration. However, it has the disadvantage that the superposed synthetic resin sheets tend to darken the color test sheet and incident light is reflected by several sheets to provide luster, and, as a result, the impression of the color test sheet thus prepared becomes different from copies actually obtained by a conventional printing press.

In the known surprint type of color proofing method, a color proofing sheet is prepared by successively superposing differently colored layers upon each other on a single sheet. In this method, various toners are applied to a single, common, opaque base, or light-sensitive layers of corresponding colors are provided successively on an opaque base.

This type of method is described in, for example, U.S. Pat. Nos. 3,671,236 and 3,136,637.

This surprint type method has the advantage that color density is not influenced by the synthetic resin base. This method more closely resembles the actual printing process and eliminates the color distortion caused upon superposing the sheets. However, it has the defect that it produces weak images.

Various processes for producing copies of an image embodying photopolymerization and thermal transfer techniques are also known. Examples thereof are described in U.S. Pat. Nos. 3,060,023, 3,060,024, 3,060,025, 3,481,736 and 3,607,264. In these processes, a photopolymerizable layer coated on a suitable support is imagewise exposed through a color separation negative.

The surface of the exposed layer is then pressed into contact with the image-receiving layer of a separate element, and at least one of the elements is heated to a temperature above the transfer temperature of the unexposed portions of the layer. The two elements are then separated, whereupon the thermally transferrable, unexposed image areas of the composite transfer to the image-receiving element by the heat of the composite. If the element is not precolored, the tacky unexposed image may now be selectively colored with a suitable toner which preferentially adheres to the unpolymerized material. The lamination, exposure, and development steps are carried out for the respective colors in sequence, thus making the process time-consuming. In addition, the above process also produces only a weak image, and, hence, it is necessary, for practical use, to provide a protective layer after image formation.

U.S. Pat. No. 3,721,557 describes a method of transferring colored images, which involves a stripping layer between a light-sensitive layer and a carrier. When the light-sensitive layer is exposed to actinic light and developed, more soluble portions thereof are selectively removed to produce a visible image. The image-carrying carrier is pressed against a suitable image-receiving member and, subsequently, the carrier is stripped to accomplish image transfer.

A fresh layer of adhesive is applied to the image-receiving member for each subsequent transfer. The extra two steps (1) of coating a stripping layer between the light-sensitive layer and the carrier and (2) application of an adhesive after each image transfer are time consuming and costly. In addition, the image buildup in a four-color proof is so thick that it produces moire patterns and the image is so distorted that the proof cannot by any cleaner or truer than an overlay proof.

Most of the above described processes are positive working systems. Some require expensive and sophisticated transfer equipment and depend on sequential lamination (pressure and heat), exposure, and transfer (or delamination of a polymer) processes for each color used. This makes the total process very time consuming.

Further, U.S. Pat. No. 4,304,836 discloses a color proofing system applicable to both the overlay type method and the surprint type method.

In this color proofing system, (1) various color separation images are formed on transparent carrier sheets, (2) an adhesive layer is provided on an intermediate carrier, (3) a paper and the intermediate carrier are superposed upon each other to transfer the adhesive layer to the paper, (4) one image-carrying sheet is pressed into contact with the image-receiving sheet covered with an adhesive layer to transfer the image to the adhesive layer in the state of being embedded in the adhesive layer, and (5) each additional image is registered on the preceding image and press-transferred in the same manner.

This method is quite advantageous in that it enables one to conduct both the simple overlay type method and the surprint type method providing copies more resembling actual print copies. However, it has the defect that the finally obtained image has weak scratch resistance and some tackiness due to the softness and tackiness of the adhesive layer.

In order to raise scratch resistance and reduce tackiness, the adhesive layer must be made harder and less tacky. This, however, requires extremely high temperature or pressure image embedding, resulting in a deterioration of the transfer fidelity of the image. A problem always encountered with the above described surprint type method is also weakness of image strength. Halftone dot images tend to drop unless processing is carefully conducted or the images produced are handled with care.

An object of the present invention is to overcome the problems with the above conventional methods and to provide a color proofing sheet which can be used in a simple process for both the overlay type method and the surprint type method which yields final images having high strength.

SUMMARY OF THE INVENTION

As a result of intensive research with the above described points in mind, the inventors found that the above object can be attained by successively transferring color image registration formed on different transparent supports to a photopolymerizable, image-receiving layer having a transparent support under heat and pressure and then retransferring all images to white paper upon which the composite image is all over exposed through the transparent support of the image-receiving layer to completely harden the image-containing image-receiving layer, whereby an image having high strength can be obtained through a simple procedure of the surprint type method.

Thus, the object of the present invention can be specifically attained by a process for preparing a color proofing sheet, which comprises imagewise exposing a light-sensitive, image-forming material comprising a transparent support having provided thereon a dye- or pigment-containing light-sensitive photoresist composition layer or both a dye- or pigment-containing colorant layer and a light-sensitive photoresist composition layer through a color separation mask, developing the material to form a color separation image, transferring the color separation image onto an image-receiving layer, then transferring in registration at least one more color separation image on the same image-receiving layer to obtain a multicolored color proofing sheet on a single support, said image-receiving layer being photopolymerizable and being exposed after the image transfer in an amount sufficient to cause photopolymerization.

BRIEF DESCRIPTION OF THE DRAWINGS

FIG. 6 shows a cross section of the image-receiving layer after the same has received three images.

Figure 1:
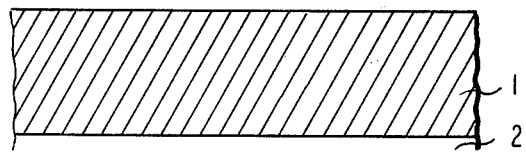
FIG. 1 shows a cross section of a photopolymerizable, image-receiving layer in accordance with the present invention.
Figure 2:
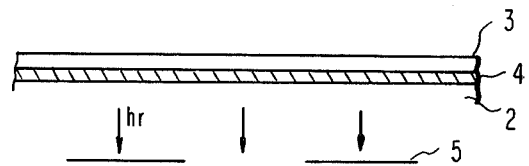
FIG. 2 shows a cross section of a positive working image-forming material of the present invention of a two-layered structure where a colorant layer and a light-sensitive layer are separated from each other.
Figure 3:
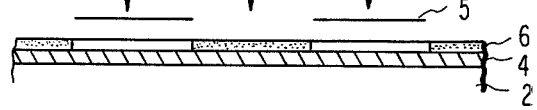
FIGS. 3 to 4 show exposure and development steps per the present invention.
Figure 4:
Figure 5:
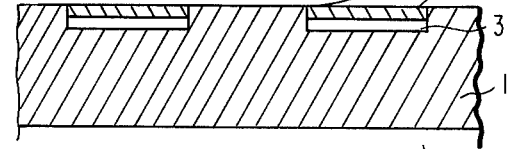
FIGS. 5 to 6 show the process of transferring images to the photopolymerizable image-receiving layer where
Figure 6:
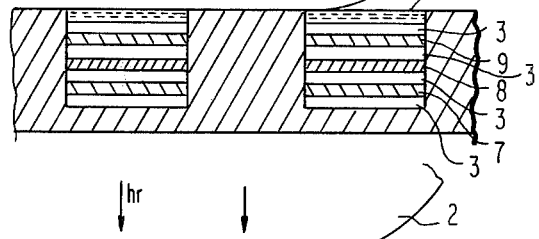
Figure 7:
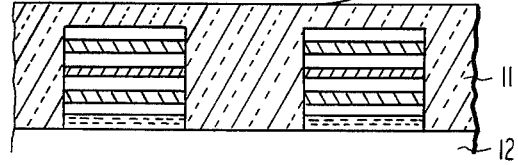
FIG. 7 shows the step of transferring the photopolymerizable image-receiving layer having received the images to a final image-receiving paper.

In these figures, numeral 1 designates a photopolymerizable image-receiving layer, 2 a transparent support, 3 a light-sensitive layer, 4 a colorant layer, 5 a color separation positive mask, 6 a light-sensitive layer insolubilized by exposure, 7 colorant layer (1), 8 colorant layer (2), 9 colorant layer (3), 10 colorant layer (4), 11 an image-receiving layer hardened by exposure, 12 a final image-receiving paper and "hr" a light energy.

DETAILED DESCRIPTION OF THE INVENTION

As the support of the image-receiving layer, various bases can be used, with biaxially oriented and transparent polyethylene terephthalate being preferable in view of its dimensional stability to water and heat. However, acetate films, polyvinyl chloride films, polystyrene films and polypropylene films can also be used so far as they have a sufficient transparency.

The image-receiving layer contains a photopolymerizable component to increase the image film strength after the transfer of color separation images, i.e., which is to be hardened by exposure (hereafter referred to as a photopolymerizable image-receiving layer). Another effect of the incorporation of a photopolymerizable component is as follows. Images transferred to the image-receiving layer are reversed and are preferably retransferred to a white paper as is used in actual printing. In general, an image-receiving layer hardened by exposure shows reduced adhesion for the aforesaid transparent support, and, hence, delamination of the transparent support of the image-receiving layer upon retransfer of the image to a white paper can be conducted with ease. The term "photopolymerizable" as used herein refers to systems in which the molecular weight of at least one component of the photosensitive layer is sufficiently increased by exposure to actinic light to result in a change in the rheological and thermal behavior of the exposed areas.

A preferred photopolymerizable image-receiving layer of the present invention comprises:

(a) at least one polyfunctional vinyl or vinylidene compound capable of forming a polymer by addition polymerization;

(b) an organic polymer binder; and (c) a photopolymerization initiator activated by actinic light; and, if desired or necessary, a thermal polymerization inhibitor.

Suitable polyfunctional vinyl or vinylidene compounds usable in the present invention include compounds disclosed in Japanese Patent Publications 5093/1960, 14719/1960 and 28727/1969. For example, unsaturated esters of polyols, particularly acrylic or methacrylic acid esters such as ethylene glycol diacrylate, glycerol triacrylate, ethylene glycol dimethacrylate, 1,3-propanediol dimethacrylate, polyethylene glycol dimethacrylate, 1,2,4-butanetriol trimethacrylate, trimethylol ethane triacrylate, pentaerythritol di-, tri-, and tetramethacrylate, pentaerythritol di-, tri- and tetraacrylate, dipentaerythritol polyacrylate, 1,3-propanediol diacrylate, 1,5-pentanediol dimethacrylate, the bis acrylates and methacrylates of polyethylene glycols having a molecular weight 200 to 400 and the like; unsaturated amides, particularly those of acrylic or methacrylic acids with α,ω-diamines whose alkylene chain may be interrupted by oxygen atom, e.g., methylene bisacrylamide and ethylene bismethacrylamide. However, the vinyl or vinylidene compounds illustrated above are not to be construed as limitative.

As the photopolymerization initiator, those which show low absorption in the visible region are preferable, and the following are non-limiting examples thereof: aromatic ketones such as benzophenone, Michler's ketone (4,4'-bis(dimethylamino)benzophenole), 4,4'-bis(diethylamino)benzophenone, 4-methoxy-4'-dimethylaminobenzophenone, 2-ethylanthraquinone, phenanthraquinone, and other aromatic ketones; benzoin; benzoin ethers such as benzoin methyl ether, benzoin ethyl ether, and benzoin phenyl ether; benzoins such as methylbenzoin, ethylbenzoin, etc., and 2,4,5-triacrylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, and similar dimers described in U.S. Pat. Nos. 3,479,185 and 3,784,557 and British Patent 1,047,569.

The organic polymer binder must be thermoplastic to obtain good image transfer properties and, in view of compatibility with the aforesaid monomer compounds and photopolymerization initiators, vinyl high molecular weight substances are particularly preferred. As the vinyl high molecular weight substances, there can be illustrated polyvinyl chloride, polyacrylic acid, polymethyl acrylate, polyethyl acrylate, polybutyl acrylate, polymethacrylic acid, polymethyl methacrylate, polyvinyl ether, polyvinyl acetal, copolymers thereof, etc., though the binders are not limited to the same. These polymer binders may have a molecular weight of from about 1,000 to 2,000,000, however, those having a molecular weight of less than 1,000 or more than 2,000,000 can be used depending on the required performance. A suitable compounding ratio of the monomer compound to the organic polymer binder varies depending upon the combination of the monomer compound and the organic polymer binder used but, in general, the monomer-to-binder ratio preferably ranges from 0.1:1.0 to 2.0:1.0 (by weight). The photopolymerization initiator is preferably present in the range of from 0.01 to 20 wt% based on the monomer compound.

Examples of the thermal polymerization inhibitor include p-methoxyphenol, hydroquinone, alkyl- or aryl-substituted hydroquinone, tert-butylcatechol, pyrogallol, naphthylamine, β-naphthol, phenothiazine, pyridine, nitrobenzene, p-toluquinone, arylphosphites, etc., which are not to be construed as limitative. These inhibitors are used in an amount of about 0.001 to 5 wt% based on the monomer compounds.

The minimum thickness of the photopolymerizable image-receiving layer is such that a four-color image formed can be transferred in the state of being embedded in the layer, and the layer is suitably coated in a solid amount of 4 g/m$^2$ to 40 g/m$^2$, depending upon the thickness of the color image. It is preferred that the image-receiving layer polymerized by exposure has a transmission density (at 400 nm) of lower than 0.3.

Processes for conducting color proofing according to the surprint type method are described below in order.

(1) A first color separation image obtained by development is superposed on the aforesaid photopolymerizable image-receiving layer, and the composite is passed through a heat laminater while applying heat and pressure. The applied heating temperature is in a range of from about 20° to 200° C. and the applied pressure is at most about 40 kg/cm$^2$. The separation image is thus transferred to the photopolymerizable image-receiving layer in the state of being embedded therein by the heat and pressure applied thereto upon passage through the laminater.

(2) A second, third, and, in some cases, a fourth color separation image are successively registered on the first color separation image and transferred in the same manner to form four color separation images in the photopolymerizable image-receiving layer in an embedded state.

(3) Subsequently, the photopolymerizable image-receiving layer containing the transferred four color separation images is superposed in intimate contact onto a white paper support, and the resulting composite is passed through a heat laminater while applying heat or pressure or applying both heat and pressure to bind the image-receiving layer to the white paper support.

(4) The whole surface of the resulting composite is exposed to actinic light through the transparent support of the photopolymerizable image-receiving layer to photoharden the photopolymerizable image-receiving layer. A light source for the actinic light is a high pressure mercury lamp, xenon lamp, carbon arc lamp, halogen lamp or fluorescent lamp, which radiates UV rays or visible rays and activates the photopolymerization initiator. The exposure may also be accomplished using laser, electron rays or X-rays.

(5) The transparent support is peeled away to obtain well registered four color separation images having high image film strength transferred onto the white paper.

As the support of the light-sensitive image-forming material used in the present invention, polyester films, particularly biaxially oriented polyethylene terephthalate films, are preferred in view of their dimensional stability to water and heat. However, acetate films, polyvinyl chloride films, polystyrene films and polypropylene films can also be used. These films may be used as such, or, in order to improve the transferability of the formed image, they may be subjected to a parting treatment with a conventional oil-repellent material or a conventional subbing layer may be provided thereon.

As the oil-repellent material, there are silicone resins, fluorine-containing resins, and fluorine-containing surfactants and, as the subbing layer, there can be illustrated those which show only weak adhesion to the transparent support, such as an alcohol-soluble polyamide, a blend of a partially esterified styrene/maleic anhydride copolymer and methoxymethylated nylon, polyvinyl acetate, a polyacrylate, a polymethyl methacrylate/acrylate copolymer, polyvinyl chloride, a vinyl chloride/vinyl acetate copolymer, polyvinyl butyrate, cellulose acetate phthalate, cellulose diacetate, cellulose triacetate, polyvinyl alcohol, etc. It is preferred that the subbing layer remains on the support after development, because the presence of the subbing layer on the support can widen the latitude of development.

As the material forming the light-sensitive photoresist layer provided on a support, various materials can be used, with an alkali-developable light-sensitive photoresist layer being preferred. Specifically, there can be illustrated light-sensitive resin compositions containing an o-quinonediazide as a light-sensitive agent. Additionally, as materials for forming a negative working light-sensitive photoresist layer, a composition prepared by blending an azide type light-sensitive agent such as 2,6-di(4'-azidobenzal)cyclohexane with a novolak type phenol-formaldehyde resin, and a photopolymerizable light-sensitive composition prepared by blending a polyfunctional monomer such as trimethylolpropane triacrylate with a photopolymerization initiator such as Michler's ketone using a benzyl methacrylate/methacrylic acid copolymer (molar ratio: e.g., 7:3) as a binder are preferred.

The colorants used are either pigments or dyes. Pigments and dyes for particular use in color proofing must have yellow, magenta, cyan and black tones as are required in color proofing. In addition, metal powders, white pigments, fluorescent pigments, etc., are also employed. Several examples of useful pigments and dyes known in the art are illustrated below. (C.I. means Color Index.)
Victoria Pure Blue (C.I. 42595)
Auramine O (C.I. 41000)
Cathilon Brilliant Flavin (C.I. basic 13)
Rhodamine 6GCP (C.I. 45160)
Rhodamine B (C.I. 45170)
Safranine OK 70:100 (C.I. 50240)
Erioglaucine X (C.I. 42080)
Fast Black HB (C.I. 26150)
No. 1201 Lionol Yellow (C.I. 21090)
Lionol Yellow GRO (C.I. 21090)
Shimura-Fast Yellow 8GF (C.I. 21105)
Benzidine Yellow 4T-564D (C.I. 21095)
Shimura-Fast Red 4015 (C.I. 12355)
Lionol Red 7B 4401 (C.I. 15850)
Fastogen Blue TGR-L (C.I. 74160)
Lionol Blue SM (C.I. 26150)
Mitsubishi Carbon Black MA-100
Mitsubishi Carbon Black #40

The light-sensitive photoresist used in the image-forming material is coated in a solid amount of 1 g/m$^2$ to 5 g/m$^2$, and the amount of pigment or dye added preferably ranges from 1 to 30 wt% based on the weight of the total solids in the layer.

Alternatively, the pigments or dyes may be present in a separate layer to form a colorant layer, thus forming two separate layers, i.e., a colorant layer and a light-sensitive photoresist layer. The order of the colorant layer and the light-sensitive photoresist layer is arbitrary. However, in order to prevent a reduction of sensitivity of each color due to absorption of actinic light by the pigment or dye upon imagewise exposure and to provide uniform sensitivity for the respective colors involved, it is preferred to provide the light-sensitive layer on the colorant layer. In this case, binders for the pigment or dye may be alkali-soluble or swellable to render the layer alkali developable. Suitable binders include, for example, styrene/maleic anhydride copolymers, polymethyl methacrylate, polyvinyl butyral, alcohol-soluble polyamides, polyvinyl acetate, maleinate resins, terpene phenol resins and mixtures thereof.

The total amount of the colorant layer is preferably 0.2 g/m$^2$ to 10 g/m$^2$, and the content of the pigments or dyes added to the colorant layer is suitably 5 to 70 wt% based on the weight of the total solids. If the content is less than 5 wt%, the colorant layer having a sufficient thickness to provide the necessary density becomes so thick that there results poor image quality upon development processing, whereas if more than 70 wt% is used the colorant layer film becomes too fragile.

Development of the light-sensitive image-forming material can be conducted using an aqueous solution or an organic solvent solution, and is preferably conducted using an aqueous alkaline solution of sodium hydroxide, potassium hydroxide, sodium silicate, potassium silicate, trisodium phosphate, tripotassium phosphate, sodium carbonate, potassium carbonate, triethanolamine, etc. The addition of a surfactant or an organic solvent to the developing solution in a small amount is effective to improve wetting properties and shorten developing time, thus being preferable. For example, benzyl alcohol, methyl cellosolve, ethyl cellosolve, butyl cellosolve and phenyl cellosolve can be used as the organic solvent, and sodium alkyl naphthalenesulfonate and polyoxyethylene octylphenyl ether can be used as the surfactant.

Imagewise exposure is conducted using color separation masks and irradiating the light-sensitive image-forming material containing a corresponding colorant with ultraviolet rays. After the imagewise exposure, the material is developed with the aforesaid aqueous alkaline developing solution, washed with water and dried. This procedure is repeated as often as necessary with differently colored elements to obtain the desired separation image with the desired colors. The thus obtained image is then transferred to the aforesaid image-receiving layer.

Having generally described the invention, the following working examples are provided to illustrate the same in more detail.

EXAMPLE 1

Four light-sensitive layer solutions of the following formulations were prepared.

| | Yellow (g) | Magenta (g) | Cyan (g) | Black (g) |
|---|---|---|---|---|
| Adduct of acetone-pyrogallol condensate (average polymerization degree: 3) and 2-diazo-1-naphthol-4-sulfonyl chloride | 1.02 | 0.61 | 0.87 | 1.26 |
| Novolak type phenol-formaldehyde resin (product of Sumitomo Dures Co., Ltd.; PR-50716) | 2.87 | 1.72 | 2.44 | 3.52 |
| Abietic acid | 1.23 | 0.73 | 1.05 | 1.52 |
| Cathilon Brilliant Yellow 5GL | 1.064 | 0.096 | — | 1.2 |
| Rhodamine 6GCP | — | — | — | 0.54 |
| Rhodamine B | — | 0.102 | — | — |
| Safranine OK 70:100 | — | 0.384 | 0.012 | — |
| Victoria Pure Blue | — | — | 0.57 | 0.40 |
| Erioglaucine X | — | — | 0.618 | — |
| Tricresyl phosphate | 0.51 | 0.31 | 0.44 | 0.64 |
| Methyl ethyl ketone | 19.0 | 19.5 | 17.0 | 18.0 |
| Methyl cellosolve acetate | 44 | 43.5 | 42.5 | 43.5 |
| Methyl cellosolve | 44 | 43.5 | 42.5 | 43.5 |
| *Fluorine-containing surfactant (FC-430, product of 3M) | 0.04 | 0.04 | 0.04 | 0.04 |

*Perfluoroalkyl oligomer having both a hydrophilic group and a hydrophobic group The thus obtained solutions were filtered through Toyo Filter Paper No. 63, and coated, respectively, on 100 μm thick biaxially oriented polyethylene terephthalate films using a whirler to form light-sensitive layers of the respective colors, then dried to prepare positive working colored light-sensitive sheets. The dry thickness of the thus formed light-sensitive layer of the respective colors were 1.0 μm for yellow, 1.0 μm for magenta, 0.8 μm for cyan and 1.3 μm for black.

The transmission densities of the thus obtained four light-sensitive layers measured by means of a Macbeth TD-504 transmission densitometer through the necessary respective color filters were as follows.

| | W | R | G | B |
|---|---|---|---|---|
| Yellow | 0.03 | 0.03 | 0.03 | 0.35 |
| Magenta | 0.36 | 0.03 | 0.73 | 0.19 |
| Cyan | 0.59 | 0.83 | 0.33 | 0.08 |
| Black | 0.91 | 0.62 | 1.43 | 0.52 |

Each of the four colored light-sensitive sheets was superposed in perfect registration on a corresponding color separation positive mask using register pins and imagewise exposed through the mask to a 2 kw super high pressure mercury lamp, Jet Light 2000 (made by Oku Products Co., Ltd.) spaced at a distance of 50 cm therefrom and developed at 32° C. using developing solution (A) of the following formulation. Exposure time and developing time are given below.

Developing Solution (A)

| NaOH | | | 6 g |
|---|---|---|---|
| Distilled water | | | 100 g |

| | Yellow | Magenta | Cyan | Black |
|---|---|---|---|---|
| Exposure Time | 15 sec | 7 sec | 7 sec | 28 sec |
| Developing Time | 5 sec | 30 sec | 15 sec | 30 sec |

Thus, four color proofing sheets of the respective colors having a perfect reproduction of the color separation mask were obtained.

Separately, a photopolymerizable image-receiving layer solution of the following formulation I filtered through a #200 nylon mesh filter was coated in layer form on a 100 μm thick biaxially oriented polyethylene terephthalate film using coating rod No. 32 made in the U.S.A. and dried for 2 minutes at 100° C. to prepare a photopolymerizable image-receiving layer sheet. The dry thickness was 28 μm.

| Formulation I | |
|---|---|
| Methyl methacrylate polymer | 90 g |
| (mean molecular weight: 100,000; | |
| product of Wako Junyaku Co., Ltd.) | |
| Pentaerythritol tetraacrylate | 90 g |
| Michler's ketone | 0.51 g |
| Benzophenone | 3.18 g |
| p-Methoxyphenol | 0.09 g |
| Methyl ethyl ketone | 220 g |

Color Proofing Steps

The four color images thus formed on the polyethylene terephthalate films can be used for color proofing of either the overlay type or the surprint type. These color image containing films were superposed in perfect registration on white paper to make an overlay proof which is usable as a color proof sheet.

In order to prepare a surprint type color proofing sheet, the black image on the polyethylene terephthalate film was superposed in perfect registration on the above prepared image-receiving layer sheet using register pins so that the image side came into contact with the image-receiving layer and laminated using a fast laminater 8B-550-80 (made by Taisei Shoji Co., Ltd.) at a pressure of 2 bars (1 bar = $10^6$ dyn/cm$^2$), a roller temperature of 100° to 120° C. and a laminating speed of 60 cm/min. The resulting composite was cooled to room temperature and the polyethylene terephthalate on the image side was peeled away.

The cyan, magenta and yellow color images were then superimposed in sequence on the same image-receiving layer in similar fashion until all four colors had been transferred. The thus obtained four-color transferred images were brought into contact with white art paper in such a manner that the image-receiving layer side came into contact with the surface of the art paper. The composite was subjected to the above fast laminater at a pressure of 2 bars, a roller temperature of 100° to 120° C. and a laminating speed of 60 cm/min, then the total surface thereof exposed for 9 seconds through the polyethylene terephthalate film on the image-receiving layer side using a 2 kw super high pressure mercury lamp, Jet Light 2000 (made by Oku Products Co., Ltd.), spaced 50 cm therefrom, followed by peeling away the polyethylene terephthalate film on the image-receiving layer side.

The peel force required for this peeling procedure, the scratch resistance of the image transferred to the art paper and the blocking resistance between the image-receiving layer transferred to the art paper and the art paper were measured under the conditions described below.

For purposes of comparison, these properties were measured with a comparative sample which had not been subjected to total exposure. The results obtained are tabulated in Table 1.

Conditions for measuring the surface of the image-receiving layer transferred to art paper are given below where "exposed" or "not exposed" or like terminology refers to the presence or absence of the total surface UV exposure, respectively.

1. Peel Force

Samples for measuring peel force were prepared by laminating a 25 μm thick polyethylene terephthalate film on the surface of the photopolymerizable image-receiving layer (which is either exposed or not exposed and transferred to the art paper) at 25° C. using Fuji Laminator D-13 (made by Fuji Photo Film Co., Ltd.). The 180° peel force between the image-receiving layer surface and the surface of the polyethylene terephthalate film was measured while keeping the image-receiving layer flat using a Tensilon UTM-II-20 tensile strength tester (made by Toyo Borldwin Co., Ltd.) (peeling speed: 40 mm/min; width of peeled sample: 50 mm).

2. Scratch Resistance

Scratch resistance of the surface of the photopolymerizable image-receiving layer transferred to the art paper and either exposed or not exposed was measured using a 0.5 mm φ sapphire needle (model HEIDON-18 scratch resistance tester (made by Shinto Kagaku Co., Ltd.).

3. Blocking Resistance

The photopolymerizable image-receiving layer transferred to the art paper was cut into 5×5 cm pieces and, after or without exposure, the samples were moisture-conditioned (45° C., 75% RH). The sample was then superposed so that the image-receiving layer surface and the art paper surface were brought into contact with each other and a load of 1.2 kg was applied to the composite horizontally placed between 2 mm thick stainless steel plates for one day and kept at 45° C. and 75% RH to examine the degree of blocking on each surface.

Evaluation of Blocking Resistance

A: No adhesion
B: Adhesion marks around the periphery
C: Adhesion and paper peeling found partly between the art paper and the image-receiving layer
D: Adhesion and paper peeling found almost all over between the art paper and the image-receiving layer

TABLE 1

|  | Peel Force g/50 mm | Blocking Resistance | Scratch Resistance (g) |
|---|---|---|---|
|  | of the Surface of the Image-Receiving Layer Transferred to the Art Paper | | |
| Unexposed | 200 | D | 50 |
| Exposed | No adhesion | A | 200 |

It can be seen from the above results that the image-receiving layer of the present invention shows remarkably improved performance in non-tackiness, blocking resistance and scratch resistance due to the total exposure after being transferred to art paper.

EXAMPLE 2

Mother liquors A and B of the following formulations for preparing pigment dispersions were prepared.

| Mother Liquor A | |
|---|---|
| Styrene/maleic anhydride copolymer | 20 g |
| n-Propanol | 80 g |
| Mother Liquor B | |
| Methoxymethylated nylon (Tresin MF-30, product of Teikoku Kagaku Sangyo Co., Ltd.) | 10 g |
| Methanol | 90 g |

Four color pigment dispersions of the following formulations were prepared using mother liquors A and B.

|  | Yellow (g) | Magenta (g) | Cyan (g) | Black (g) |
|---|---|---|---|---|
| Mother Liquor A | 95 | 95 | 95 | 95 |
| Mother Liquor B | 30 | 30 | 30 | 30 |
| n-Propanol | 28 | 28 | 28 | 28 |
| Acetone | 20 | 20 | 20 | 20 |
| Seika Fast Yellow H-0755 (product of Dainichiseika Color & Chemical Mfg. Co., Ltd.) | 12.2 | — | — | — |
| Seika Fast Carmin 1483 (product of Dainichiseika Color & Chemical Mfg. Co., Ltd.) | — | 12.2 | — | — |
| Cyanine Blue 4920 (product of Dainichiseika Color & Chemical Mfg. Co., Ltd.) | — | — | 12.2 | — |
| Mitsubishi Carbon Black MA-100 (product of Mitsubishi Chemical Industries, Ltd.) | — | — | — | 12.2 |

Dispersion was conducted for 6 hours in a testing dispersing machine (paint shaker made by Toyo Seiki Co., Ltd.). Then, a diluent solution of the following formulation was prepared for the pigment dispersion.

Diluent Solution

| n-Propanol | 40 g |
|---|---|
| Acetone | 28 g |
| Fluorine-containing surfactant (Florad FC-430, product of 3M) | 0.2 g |

The four pigment dispersions were diluted with the above described diluent solution at the weight ratios tabulated below, and then were subjected to stirring for 10 minutes and to ultrasonic wave dispersion for 10 minutes to obtain pigment layer coating liquids. Each of the coating liquids was filtered through Toyo Filter Paper No. 63 and coated on a 100 μm thick biaxially oriented polyethylene terephthalate film using a whirler and dried at 100° C. for 2 minutes to prepare pigment layers of the respective four colors.

|  | Pigment Dispersion/Diluent Solution Weight Ratio | Dry Film Thickness (μm) | Optical Density | |
|---|---|---|---|---|
| Yellow | 3.5/46.5 | 2.1 | Blue filter | 0.5 |
| Magenta | 4/46 | 0.65 | Green filter | 0.75 |
| Cyan | 4/46 | 0.75 | Red filter | 0.65 |
| Black | 5.5/44.5 | 0.7 | No filter | 0.9 |

On each of the pigment layers of the respective four colors there was coated a positive working light-sensitive solution of the following formulation filtered through No. 63 filter using a whirler, then dried at 100° C. for 2 minutes to prepare colored light-sensitive sheets of the respective four colors.

Positive Working Light-Sensitive Solution

| Adduct of acetone/pyrogallol condensate (mean molecular weight: 3) and 2-diazo-1-naphthol-4-sulfonyl chloride (molar ratio 1:1) | 15 g |
|---|---|
| Novolak type phenol/formaldehyde resin (PR-50904, product of Sumitomo Dures Co., Ltd.) | 120 g |
| n-Propyl acetate | 280 g |

The colored light-sensitive sheets of the four colors were exposed for 15 seconds using the same apparatus as in Example 1, and developed for 15 seconds at 32° C. using developing solution (B) of the following formulation.

Developing Solution (B)

| NaOH | 6 g |
|---|---|
| Surfactant (*Perex NBL, product of Kao Atlas Co., Ltd.) | 100 g |
| Distilled water | 900 g |

*Sodium alkylnaphthalene sulfonate

The images of the four colors thus formed on the polyethylene terephthalate film can be used for color proofing of either the overlay type or the surprint type by subjecting them to the same color proofing steps as in Example 1. In the latter case, there was obtained a color proofing sheet realizing color reproduction essentially the same as actual print copies and has a good image strength and non-tackiness.

EXAMPLE 3

On each of the pigment layers of the four colors obtained in Example 2 were coated in sequence a negative working light-sensitive solution and an overcoat solution of the following formulations using a whirler and the same were dried at 100° C. for 2 minutes to obtain negative working colored light-sensitive sheets of the four colors.

Negative Working Light-Sensitive Solution

| | |
|---|---|
| Pentaerythritol tetraacrylate | 43.2 g |
| Benzyl methacrylate/methacrylic acid copolymer (BMA/MA = 73/27 molar ratio; [η]25° C. MEK = 0.12) | 60 g |
| Michler's ketone | 0.41 g |
| Benzophenone | 2.54 g |
| p-Methoxyphenol | 0.12 g |
| Methyl cellosolve acetate | 120 g |
| Toluene | 680 g |
| Cyclohexanol | 40 g |

Overcoat Solution

| | |
|---|---|
| Polyvinyl alcohol (GL-05, product of Nippon Synthetic Chemical Industry Co., Ltd.) | 60 g |
| Distilled water | 970 g |
| Methanol | 30 g |

Each of the negative working colored light-sensitive sheets of the four colors was superposed on a corresponding mask in perfect registration using register pins, exposed to a 2 kw super high pressure mercury lamp, Jet Light 2000, spaced at a distance of 50 cm therefrom for 5 seconds, then developed at 35° C. for 20 to 25 seconds using developing solution (C) of the following formulation.

Developing Solution (C)

| | |
|---|---|
| $Na_2CO_3$ | 15 g |
| Butyl cellosolve | 3 g |
| Distilled water | 1 liter |

The four color images on polyethylene terephthalate film were subjected to the same color proofing steps as in Example 1, and there was obtained a color proofing sheet realizing color reproduction essentially the same as actual print copies and has a good image strength and non-tackiness.

EXAMPLE 4

Each of the following subbing solutions (1) and (2) of the following formulations was coated on a 100 μm thick biaxially oriented polyethylene terephthalate film in a dry thickness of 0.3 μm and dried. On each of the two subbing layers there were coated, in sequence, the same pigment layer and positive working light-sensitive layer as in Example 2 to prepare colored light-sensitive sheets of four colors.

These colored light-sensitive sheets were then exposed and developed in the same manner as in Example 2 and then subjected to the same color proofing steps as in Example 1. The thus obtained color proofing sheet has a good image strength and non-tackiness.

Subbing Solution (1)

| | |
|---|---|
| Alcohol-soluble polyamide (CM8000, product of Toray Industries, Inc.) | 8.5 g |

-continued

| | |
|---|---|
| Nitrocellulose RS½ (wetted with 15 wt % of isopropyl alcohol) | 0.05 g |
| Methanol | 400 g |
| Methyl cellosolve | 100 g |

Subbing Solution (2)

| | |
|---|---|
| Mother liquor A of Example 2 | 1.25 g |
| Mother liquor B of Example 2 | 2.5 g |
| Diluent solution of Example 2 | 46.3 g |

EXAMPLE 5

On a 100 μm thick biaxially oriented polyethylene terephthalate film was coated each of the photopolymerizable image-receiving layer solutions of the following formulations II and III in the same manner as in Example 1 then dried to prepare image-receiving layer sheets. The dry thickness was 28 μm.

| Formulation II: | |
|---|---|
| Vinyl chloride/vinyl acetate/vinyl alcohol copolymer (composition ratio: 91:3:6 (wt)) (Eslec A, product of Sekisui Chemical Co., Ltd.) | 90 g |
| Pentaerythritol tetraacrylate | 54 g |
| Michler's ketone | 0.51 g |
| Benzophenone | 3.18 g |
| p-Methoxyphenol | 0.09 g |
| Methyl ethyl ketone | 220 g |

| Formulation III: | |
|---|---|
| Vinyl chloride/vinyl acetate copolymer (composition ratio: 75:25 (wt)) (MPR-T-5, product of Nisshin Chemical Co., Ltd.) | 90 g |
| Pentaerythritol tetraacrylate | 54 g |
| Michler's ketone | 0.51 g |
| Benzophenone | 3.18 g |
| p-Methoxyphenol | 0.09 g |
| Methyl ethyl ketone | 220 g |

The thus obtained two image-receiving layer sheets were transferred to art paper in the same manner as in Example 1 and the same measurements as in said Example were conducted. The results thus obtained are shown in Table 2.

TABLE 2

| | | Peel Force* g/50 mm | Blocking* Resistance | Scratch* Resistance (g) |
|---|---|---|---|---|
| Formulation II | Exposed | No adhesion | A | 300 |
| | Unexposed | 300 | D | 50 |
| Formulation III | Exposed | No adhesion | B | 500 |
| | Unexposed | 1,000 | D | 100 |

*Of the surface of image-receiving layer transferred to art paper.

Table 2 shows that when the image-receiving layer of the present invention is exposed after being transferred to the art paper, its surface shows almost no adhesion and it acquires markedly raised scratch resistance. In addition, blocking resistance between the image-receiving layer and the art paper is so improved that no trouble takes place even when many image-transferred art paper sheets are piled up and stored.

While the invention has been described in detail and with reference to specific embodiments thereof, it will be apparent to one skilled in the art that various changes and modifications can be made therein without departing from the spirit and scope thereof.

What is claimed is:

1. A process for preparing a color proofing sheet, which comprises imagewise exposing a light-sensitive image-forming material comprising a transparent support having provided thereon a dye- or pigment-containing light-sensitive photoresist composition layer or both a dye- or pigment-containing colorant layer and a light-sensitive photoresist composition layer through a color separation mask, developing the material to form a color separation image, transferring the color separation image onto a photopolymerizable image-receiving layer, transferring in registration at least one more color separation image onto the same image-receiving layer to obtain a multicolored color proofing sheet on a single support, and totally exposing the image-receiving layer after the image transfer in an amount sufficient to induce photopolymerization thereof.

2. The process of claim 1, wherein the light-sensitive image-forming material comprises the transparent support having provided thereon the dye- or pigment-containing colorant layer and the light-sensitive photoresist composition layer in that order.

3. The process of claim 1, wherein a subbing layer is provided between the support and the dye- or pigment-containing light-sensitive photoresist composition layer or between the support and the dye- or pigment-containing colorant layer.

4. The process of claim 3, wherein the subbing layer is an alcohol-soluble polyamide.

5. The process of claim 3, wherein the subbing layer remains on the support after development.

6. The process of claim 1, wherein the light-sensitive photoresist composition layer comprises a photopolymerizable light-sensitive composition.

7. The process of claim 6, wherein the light-sensitive photoresist composition layer contains an o-quinonediazide.

8. The process of claim 1, wherein the light-sensitive photoresist composition layer has a solid amount ranging of from about 1 to 5 g/m$^2$.

9. The process of claim 1, wherein the dye or the pigment has a yellow, magenta, cyan or black tone.

10. The process of claim 1, wherein the image-receiving layer comprises
   (a) at least one polyfunctional vinyl or vinylidene compound capable of forming a polymer by addition polymerization,
   (b) an organic thermoplastic polymer binder and
   (c) a photopolymerization initiator.

11. The process of claim 10, wherein the ratio of the vinyl or vinylidene compound to the polymer binder in the image-receiving layer ranges from 0.1:1.0 to 2.0:1.0 (by weight).

12. The process of claim 10, wherein the image-receiving layer has a solid amount ranging of from about 4 to 40 g/m$^2$.

13. The process of claim 10, wherein the image-receiving layer has a transmission density (at 400 nm) of lower than 0.3 after being totally exposed in an amount sufficient to induce photopolymerization.

* * * * *